United States Patent [19]

Niori et al.

[11] Patent Number: 5,280,156
[45] Date of Patent: Jan. 18, 1994

[54] WAFER HEATING APPARATUS AND WITH CERAMIC SUBSTRATE AND DIELECTRIC LAYER HAVING ELECTROSTATIC CHUCKING MEANS

[75] Inventors: Yusuke Niori, Nagoya; Kazuhiro Nobori, Haguri; Ryusuke Ushikoshi, Handa; Koichi Umemoto, Toyota, all of Japan

[73] Assignee: NGK Insulators, Ltd., Japan

[21] Appl. No.: 811,946

[22] Filed: Dec. 23, 1991

[30] Foreign Application Priority Data

Dec. 25, 1990 [JP] Japan ................. 2-418006
Nov. 19, 1991 [JP] Japan ................. 3-303289

[51] Int. Cl.$^5$ ............................. H05B 3/20
[52] U.S. Cl. ......................... 219/385; 118/725; 361/234
[58] Field of Search ............ 219/385, 411, 405; 118/500, 723, 724, 725, 728; 361/234; 269/329, 909; 279/128, 134

[56] References Cited

U.S. PATENT DOCUMENTS

| | | | |
|---|---|---|---|
| 4,502,094 | 2/1985 | Lewin et al. | 361/234 |
| 4,561,006 | 12/1985 | Currie . | |
| 4,645,218 | 2/1987 | Ooshio et al. | 361/234 |
| 4,665,463 | 5/1987 | Ward et al. | 361/234 |
| 4,771,730 | 9/1988 | Tezuka | 118/723 |
| 4,962,441 | 10/1990 | Collins | 361/234 |
| 5,231,690 | 7/1993 | Soma et al. | 392/416 |

FOREIGN PATENT DOCUMENTS

| | | | |
|---|---|---|---|
| 0360529 | 3/1990 | European Pat. Off. . | |
| 460955 | 12/1991 | European Pat. Off. | 361/234 |
| 2205912 | 8/1973 | Fed. Rep. of Germany . | |
| 2520930 | 8/1983 | France . | |
| 2638050 | 4/1990 | France . | |
| 62-286247 | 12/1987 | Japan . | |
| 1-241839 | 9/1989 | Japan . | |
| 1-315935 | 12/1989 | Japan . | |
| 3-240961 | 10/1991 | Japan | 118/725 |

OTHER PUBLICATIONS

"Improved Guard Plate", Research Disclosure, Apr. 1992, No. 336, Kenneth Moison Pubs. Ltd., England.

*Primary Examiner*—Bruce A. Reynolds
*Assistant Examiner*—John A. Jeffery
*Attorney, Agent, or Firm*—Parkhurst, Wendel & Rossi

[57] ABSTRACT

A wafer heating apparatus can be obtained which prevents formation of a local gap caused by deflection or distortion, and the like, of a wafer at the time of heating the wafer so as to improve production yield of the heat treatment of the wafers. The apparatus includes a ceramic substrate, a heat generating resistive element embedded in the ceramic substrate, a film electrode formed on a front surface of the ceramic substrate, and a ceramic dielectric layer formed on the front surface of the ceramic substrate to coat the film electrode. A direct current power source is provided to generate Coulomb's force between the wafer and the film electrode via the dielectric layer to attract the wafer to a wafer-attracting surface of the dielectric layer, while heating the wafer attracted to the wafer-attracting surface by energizing the heat generating element through application of an electric current therethrough. A method of producing the wafer heating apparatus is also disclosed.

6 Claims, 7 Drawing Sheets

FIG._1

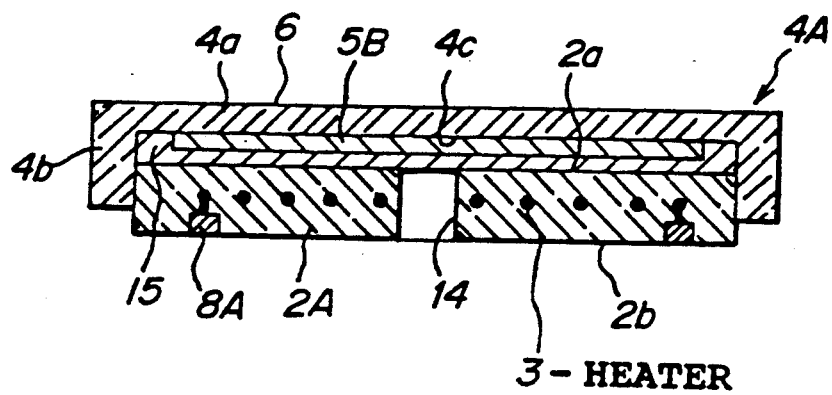
FIG_6
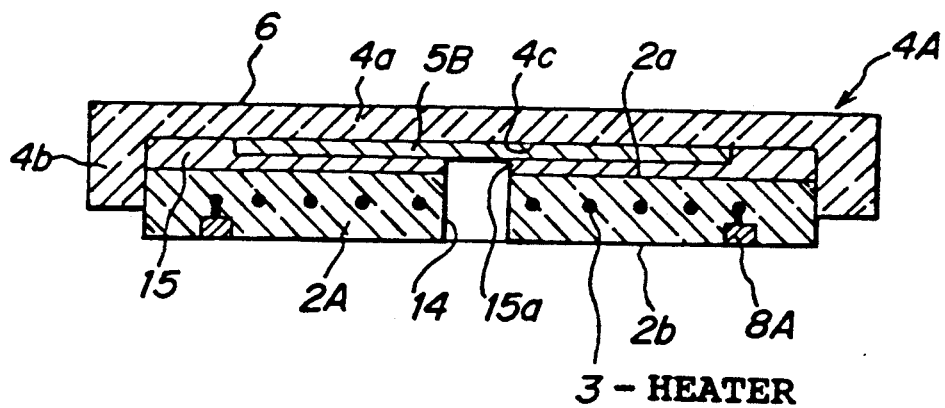
FIG_7

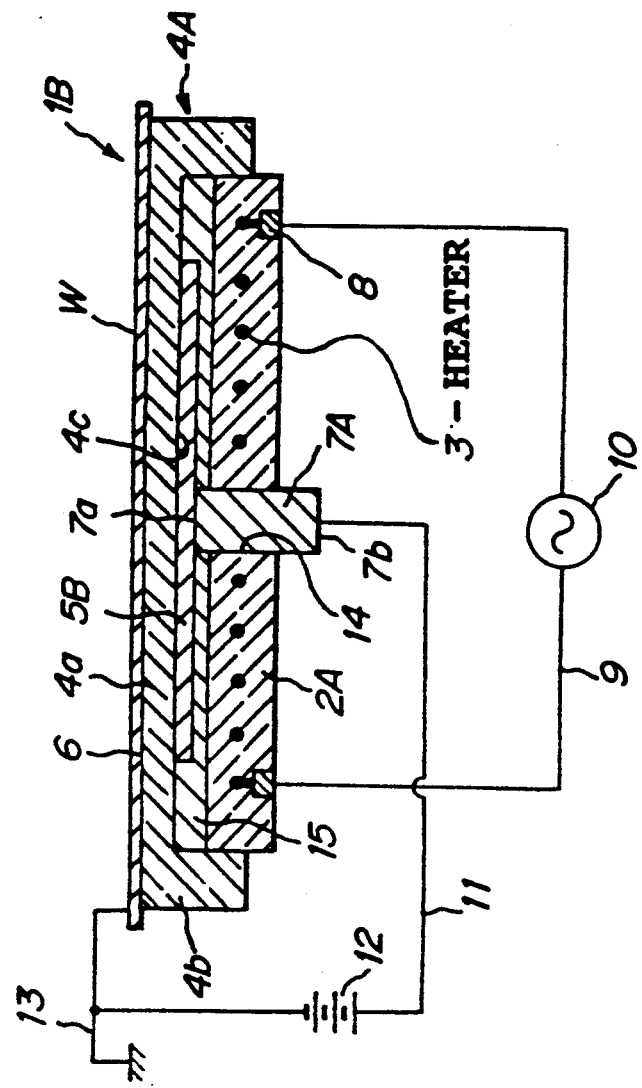

WAFER HEATING APPARATUS AND WITH CERAMIC SUBSTRATE AND DIELECTRIC LAYER HAVING ELECTROSTATIC CHUCKING MEANS

BACKGROUND OF THE INVENTION

1. Field of the Invention

The present invention relates to a wafer heating apparatus for use in semiconductor producing systems, and methods for producing the same.

2. Related Art Statement

Heretofore, chlorine series gases, fluorine series gases, and similar corrosive gases have been used as deposition, etching, or cleaning gases in semiconductor producing systems which necessitate super clean states. For that purpose, when a conventional heating apparatus having a heat-generating resistive element coated with stainless steel, inconell, or the like, metal is used as a wafer heating apparatus at a state of the wafer contacting with such a corrosive gas, the metal coated on the heat-generating resistive element produces undesirable particles of chloride, oxide or fluoride of diameters of a few $\mu m$ due to exposure to the gas.

Therefore, a wafer heating apparatus of an indirect heating system has been developed which provides an infrared radiation arranged outside of a container wherein a wafer is exposed to the deposition gas, etc., a window on an outside wall of the container for permeating an infrared radiation emitted from the lamp therethrough into the container, and a heating body made of a highly corrosion resistant material, such as graphite, for irradiating a wafer mounted on the upper surface of the heating body by the infrared radiation to heat the wafer. However, as compared with direct wafer heating apparatuses, this type of wafer heating apparatus has problems in that a large heat loss and a long heating time are required for temperature elevation, permeation of the infrared radiation is gradually prevented by a CVD film deposited on the window which causes the window to heat due to heat absorption thereof, and homogeneity and response of heating become bad due to the separate provision of the heating source lamp and the heating body mounting the wafer.

In order to solve the above problems, we studied arranged on a wafer heating apparatus having a heat-generating resistive element embedded in a dense ceramic disc. As a result, we have found out that this type of wafer heating apparatus is a superior apparatus which eliminates the above problems. However, we have also found out by further studies that there still remains a problem in holding and fixing the semiconductor wafer to the heating apparatus.

Namely, as conventional techniques of fixing a semiconductor wafer, there are known a mechanical fixing system, a vacuum chuck system, and an electrostatic system, which are used, for example, in transportation, light-exposure, film formation, fine machining, rinsing, dicing, etc., of semiconductor wafers. Meanwhile, in heating a semiconductor wafer under a controlled temperature at CVD, sputtering, epitaxial or the like, film preparing, processes, productivity, i.e., yield of production of semiconductors is decreased at the time of producing the semiconductor wafers, if a surface temperature of the semiconductor wafer is not heated homogeneously. In such a case, we have found out that, if a mechanical fixing system is adopted for fixing the semiconductor wafer, the formed film becomes uneven due to contact of a pin or a ring to the surface of the semiconductor wafer. If the semiconductor wafer is arranged at a heating surface of a disc-shaped ceramic heater, the whole surface of the semiconductor wafer is not uniformly urged against the flat surface of the heater disc, so that the semiconductor wafer is deflected and distorted to form a local gap between a portion of the semiconductor wafer and the flat heating surface of the ceramic heater disc. In a medium or a high vacuum of a pressure of not more than $10^{-3}$ Torr, a heat transfer due to gas convection is minor, so that a very large temperature difference is caused between the gap-formed portion of the semiconductor wafer and the portion of the semiconductor wafer contacting the surface of the ceramic heater disc. Namely, behavior of gas molecules at the wafer-mounted surface is in a viscous flow region at a pressure of not less than 1 Torr to allow heat flow (heat transfer) of the gas molecules. Therefore, the wafer temperature is not so considerably decreased as compared with the heater temperature even at the portion having the above gap, and shows a good followability or response to the heater temperature. However, at a medium or a high vacuum range of not more than 1 Torr, the behavior of decreased number of the gas molecules changes to a molecules-flowing region to widely decrease the heat flow due to the heat transfer of the gas molecules, so that the wafer temperature is decreased as compared with the heater temperature to worsen homogeneity and the response property of the heating.

If a vacuum chuck system is adopted for fixing the wafer, the system can not be used for sputtering, CVD or the like processes which are used under a condition of medium or high vacuum.

Though there is an electrostatic chuck using a polyimide film as a dielectric film in the so-called electrostatic chucks, a usable temperature range of conventional electrostatic chucks is around 80°–200° C. at the maximum. Therefore, the electrostatic chuck can not be adopted for fixing the wafer in a sputtering or a CVD process wherein the wafer is heated by a heating element up to a temperature of about 600° C.

SUMMARY OF THE INVENTION

An object of the present invention is to provide a wafer heating apparatus which can obviate a problem of contamination as seen in the case of using a metallic heater and the above problems of decreasing the heat efficiency as seen in the indirect wafer heating system, and which can improve homogeneity of heating of the wafer.

The present invention is a wafer heating apparatus including a ceramic substrate, a heat-generating resistive element embedded in the interior of the ceramic substrate, a film electrode formed on a front surface of the ceramic substrate, and a ceramic dielectric layer formed on the front surface of the ceramic substrate to coat the film electrode, comprising a direct current power source which generates Coulomb's force between a wafer and a wafer-attracting surface of the dielectric layer to attract the wafer to the wafer-attracting surface, while heating the wafer by heat generation of the heat-generating resistive element.

In a preferred embodiment, both the ceramic substrate and the ceramic dielectric layer are made of a same or different non-oxide series ceramic material.

The ceramic substrate may have a coefficient of thermal expansion of 0.7–1.4 times that of the wafer.

The ceramic dielectric layer may have a coefficient of thermal expansion of 0.7-1.4 times of that of the wafer.

In a preferred embodiment, the film electrode is made of an electrically conductive adhesive which joins the ceramic dielectric layer to the ceramic substrate, and at least one electric terminal is connected to the film electrode.

For producing such a wafer heating apparatus, a heat generating resistive element, possibly with at least one electric terminal, is embedded and heated in the interior of a ceramic green sheet to prepare a ceramic substrate having the heat generating resistive element embedded therein, a ceramic green sheet is sintered to prepare a ceramic dielectric layer, the ceramic dielectric layer is joined to the front surface of the ceramic substrate by means of a film electrode made of an electrically conductive adhesive, and at least one electric terminal is connected to the film electrode.

In a preferred embodiment, the film electrode is joined to a surface of the ceramic dielectric layer, a surface of the film electrode of the ceramic dielectric layer is joined to a front surface of the ceramic substrate, and at least one electric terminal is connected to the film electrode.

For producing such a wafer heating apparatus, a heat generating resistive element, possibly with at least one electric terminal, is embedded and heated in the interior of a ceramic green sheet to prepare a ceramic substrate having the heat generating resistive element embedded therein, a ceramic green sheet is sintered to prepare a ceramic dielectric layer, at least one film electrode is formed on a surface of the ceramic dielectric layer, a surface of the film electrode of the ceramic dielectric layer is joined to the front surface of the ceramic substrate by means of the film electrode made of an electrically insulative adhesive, and at least one electric terminal is connected to the film electrode.

BRIEF DESCRIPTION OF THE DRAWINGS

For a better understanding of the present invention, reference is made to the accompanying drawings, in which:

FIG. 6 is a schematic cross-sectional view of a substrate 2A joined to a dielectric layer 4A via an electrically insulative adhesive layer 15 and a film electrode 5B;

FIG. 7 is a schematic cross-sectional view of the substrate 2A of FIG. 6 wherein a portion of the electrically insulative adhesive layer 15 is peeled off;

FIG. 8 is a cross-sectional view of the substrate 2A to which a columnar terminal 7A is inserted and joined to the substrate 2A.

DESCRIPTION OF THE PREFERRED EMBODIMENTS

Hereinafter, the present invention will be explained in more detail with reference to examples.

EXAMPLE 1

Figure 1:
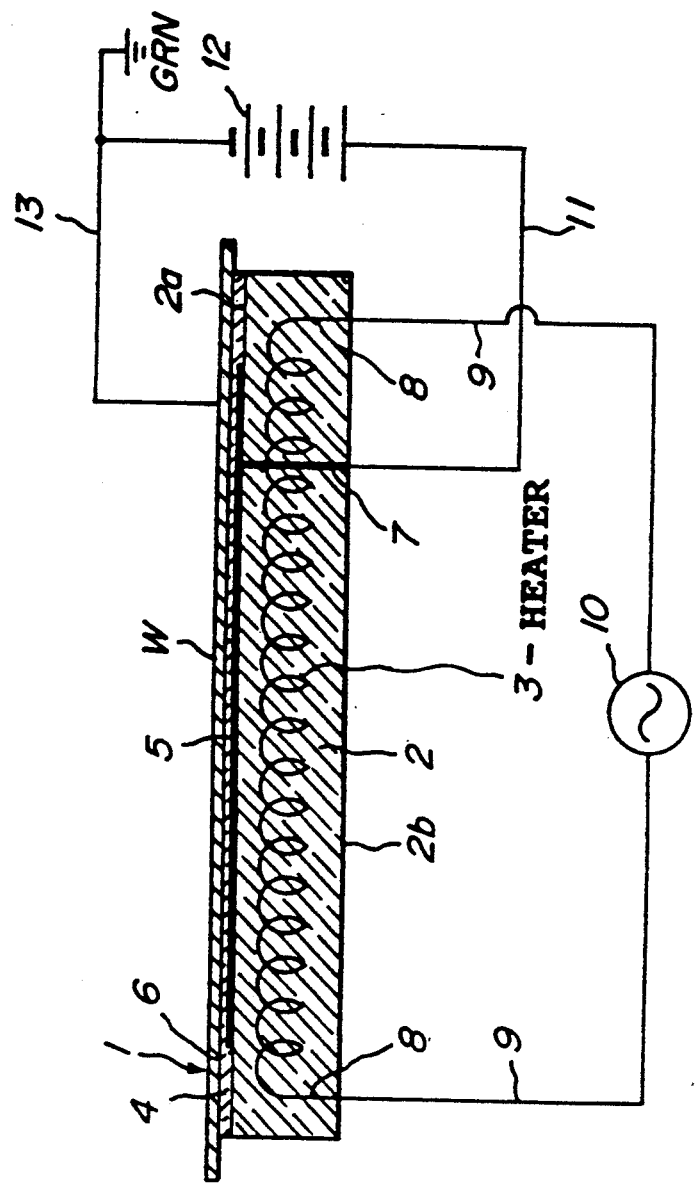
FIG. 1 is a schematic partial cross-sectional view of an example of the present wafer heating apparatus.

Referring to FIG. 1 showing a schematic cross-sectional partial view of an embodiment of the wafer heating apparatus 1 of the present invention, a ceramic substrate 2 of a disc shape, for example, is provided with a heat generating resistive element 3 embedded in the interior thereof, and the heat generating resistive element 3 is preferably wound in a spiral shape. In plan view of the ceramic substrate disc 2, the heat generating resistive element 3 is arranged in a whirl fashion. The heat generating resistive element 3 has at both ends thereof 8 connected and fixed thereto respectively for supplying an electric power thereto, and the ends of the respective terminal 8 are connected to a pair of electric power supply cables 9. The pair of cables 9 is respectively connected to a heater power source 10, and can energize the heat generating resistive element 3 upon closing a switch not shown.

The ceramic substrate disc 2 has opposing front surfaces 2a, 2b at both sides. The word "front surface" used herein means a surface relatively broader than the other surfaces.

The ceramic substrate disc 2 has a circular (for example) film electrode 5 formed along a front surface 2a thereof. A ceramic dielectric layer 4 is integrally formed on the front surface 2a so as to coat the film electrode 5. By this arrangement, the film electrode 5 is accommodated between the ceramic substrate disc 2 and the ceramic dielectric layer 4. If the film electrode 5 has a perforated shape like a punching metal, coherence of the ceramic dielectric layer 4 to the film electrode 5 is improved. The ceramic substrate 2 has a terminal 7 embedded therein, one end of the terminal 7 is connected to the film electrode 5, and the other end of the terminal 7 is connected to a cable 11. The cable 11 is connected to the positive electrode of a power source 12 of an electrostatic chuck, and the negative electrode of the direct current power source 12 is connected to an earth wire 13.

When heat treating a wafer W, the wafer W is mounted on a wafer-attracting surface 6 of the ceramic dielectric layer 4, and the wafer W is contacted with the earth wire 13. Then, a positive electric charge is accumulated on the film electrode 5 to polarize the ceramic dielectric layer 4 and a positive electric charge is accumulated on the wafer-attracting surface 6 of the ceramic dielectric layer 4, while a negative electric charge is accumulated on the wafer W, so as to attract the wafer W to the wafer-attracting surface 6 of the ceramic dielectric layer 4 by Coulomb's attracting force between the ceramic dielectric layer 4 and the wafer W. In the meantime, the heat generating resistive element 3 is energized to heat the wafer-attracting surface 6 to a desired temperature.

According to this wafer heating apparatus 1, the wafer W can be heated through heating of the wafer-attracting surface 6, while attracting the whole surface of the wafer W to the wafer-attracting surface 6 by Coulomb's force. As a result, when heating the wafer W particularly in a medium or a high vacuum, the whole surface of the wafer W shows a good response to the heating temperature of the apparatus and the wafer W can be heated uniformly, so that the decrease of the homogeneity of temperature caused by a gap between the wafer and the wafer heating surface 6 in heating the wafer W can be obviated. Therefore, the whole surface of the wafer W can be heated uniformly at the time of heating the wafer W, so that decrease of the production yield of semiconductors, for example, can be prevented in semiconductor production systems.

Moreover, the dielectric layer 4 is also made of a ceramic material, so that the dielectric layer 4 has also a high heat resistant property and can be used well in a thermal CVD system, for example. Preferably, the dielectric layer 4 is made of a ceramic material which has a high endurance to repeated abrasion and deformation of more than 10,000 times caused by the electrostatic chuck of the wafer W.

Furthermore, because the heat generating resistive element 3 is embedded in the interior of the ceramic substrate 2 and the film electrode 5 is accommodated between the ceramic dielectric layer 4 and the ceramic substrate 2, the contamination caused by a conventional metallic heater can be prevented. Moreover, the wafer W is directly heated at a state of being attracted to the wafer-attracting surface 6, so that the problem of decrease of heat efficiency occurring in the indirect heating system can be obviated.

Because the dielectric layer 4 is made of a ceramic material which has a characteristic property that an insulation resistance value (volumetric resistivity) is decreased with an increase of the ceramic temperature, the dielectric layer 4 may sometimes have a lower insulation resistance value than an appropriate insulation value of, e.g., around $10^{11}$ Ω-cm to allow a large leak current to flow. In this respect, the dielectric layer 4 has preferably an insulation resistance value of not less than $10^{11}$ Ω-cm even at a high temperature range of, e.g., 500°–600° C. for use in the wafer heating apparatus 1 of this embodiment. In this regard, alumina, beryllia, magnesia, silicon nitride (reaction sintered, or ambient pressure sintered), boron nitride, or aluminum nitride is preferably used.

The ceramic substrate 2 and the dielectric layer 4 are heated to a temperature of around 600°–1,100° C. at the maximum in a system, such as a thermal CVD system, so that they are preferably made of alumina, silicon nitride sintered body, sialon, silicon carbide, aluminum nitride, alumina-silicon carbide complex compound, etc. from a viewpoint of heat resistant property. Particularly, the ceramic substrate 2 and the ceramic dielectric layer 4 are both made of the same or different non-oxide series ceramic material. This is because the non-oxide series ceramic materials having a covalent bond, such as SiC, $Si_3N_4$, etc., emit a smaller amount of gas in a high vacuum as compared with oxide-series ceramic materials, such as alumina, etc. Namely, because of a small amount of gas to be adsorbed thereon, the non-oxide series ceramic materials can provide a small change of the voltage of withstanding insulation breakage and resistance value, etc., of the dielectric layer, as well as stable operation of the heater and the electrostatic chuck.

Particularly, if silicon nitride is adopted among the non-oxide series ceramic materials, the whole wafer heating apparatus 1 has a high strength and a high thermal shock resistant property by virtue of a low coefficient of thermal expansion of the silicon nitride, so that the wafer heating apparatus 1 is not destructed even in a repeated rapid heating to a high temperature and quenching therefrom. Because silicon nitride has a superior corrosion resistant property, the wafer heating apparatus 1 has a high durability and a long life even in a corrosive gas condition, such as in a thermal CVD system.

The ceramic substrate 2 and the ceramic dielectric layer 4 are preferably made of the same material having the same thermal expansion from an aspect of coherence, and silicon nitride is preferable for such purpose because of both properties thereof as a heater and an electrostatic chuck.

Both the coefficients of thermal expansion of the ceramic substrate 2 and the ceramic dielectric layer 4 are preferably 0.7–1.4 times of that of the wafer W. If they are beyond this range, the wafer W is cohered to the wafer-attracting surface 6 at the time of heating the wafer W, so that the wafer W is likely deformed. Combination of the materials of the substrate 2 and the dielectric layer 4 should be changed depending on the material of the wafer W. Particularly, if the wafer W is made of silicon having a coefficient of thermal expansion of $2.6 \times 10^{-6} K^{-1}$, the coefficients of thermal expansion thereof are preferably within a range of $1.82 \times 10^{-6} - 3.38 \times 10^{-6} K^{-1}$. Because silicon nitride has a coefficient of thermal expansion of $2.7 \times 10^{-6} K^{-1}$, it is most suited to the materials of the ceramic substrate 2 and the ceramic dielectric layer 4. This is because under a condition of an attracting force of not more than 100 kg/cm² for attracting the wafer W in vacuum, if alumina having a high coefficient of thermal expansion ($7 \times 10^{-6} K^{-1}$) is used, the wafer having a thickness of about 0.6 mm is forecasted to deform around 0.25% due to restrainment of the electrostatic chuck, so that damage of the wafer due to the deformation is quite large.

The wafer-attracting surface 6 is preferably a smooth flat surface and preferably has a flat surface degree of not more than 500 μm so as to prevent invasion of the deposition gas to the backside of the wafer W. As the heat generating resistive element 3, use of tungsten, molybdenum, platinum, etc., having a high melting point and a superior coherent property to silicon nitride, etc., is appropriate.

EXAMPLE 2

Figure 2:
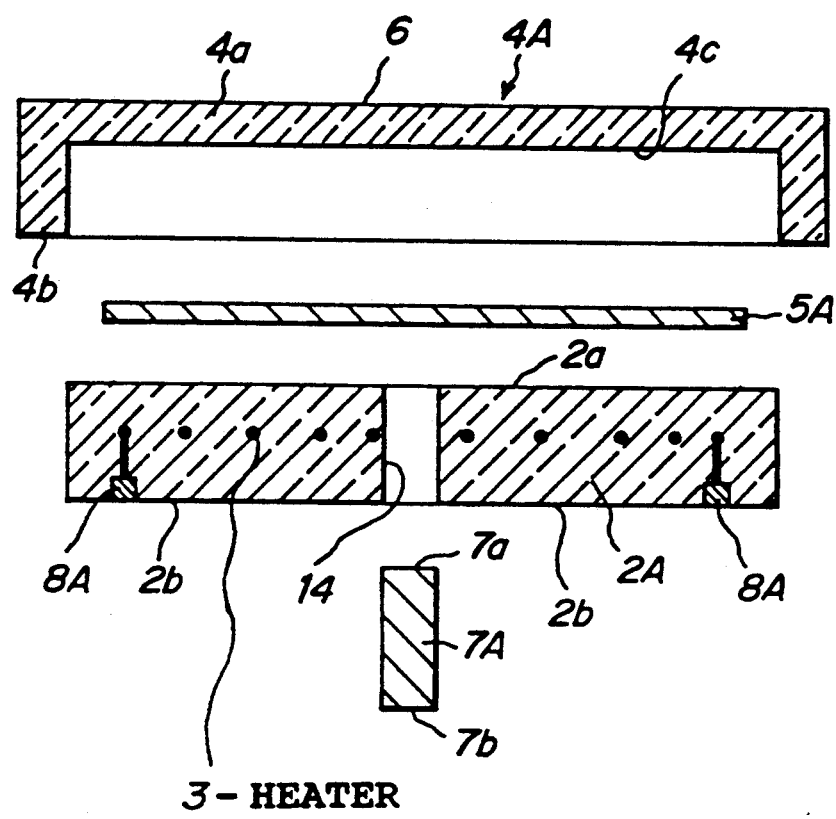
FIG. 2 is a schematic cross-sectional view of the present wafer heating apparatus before assembling.
Figure 3:
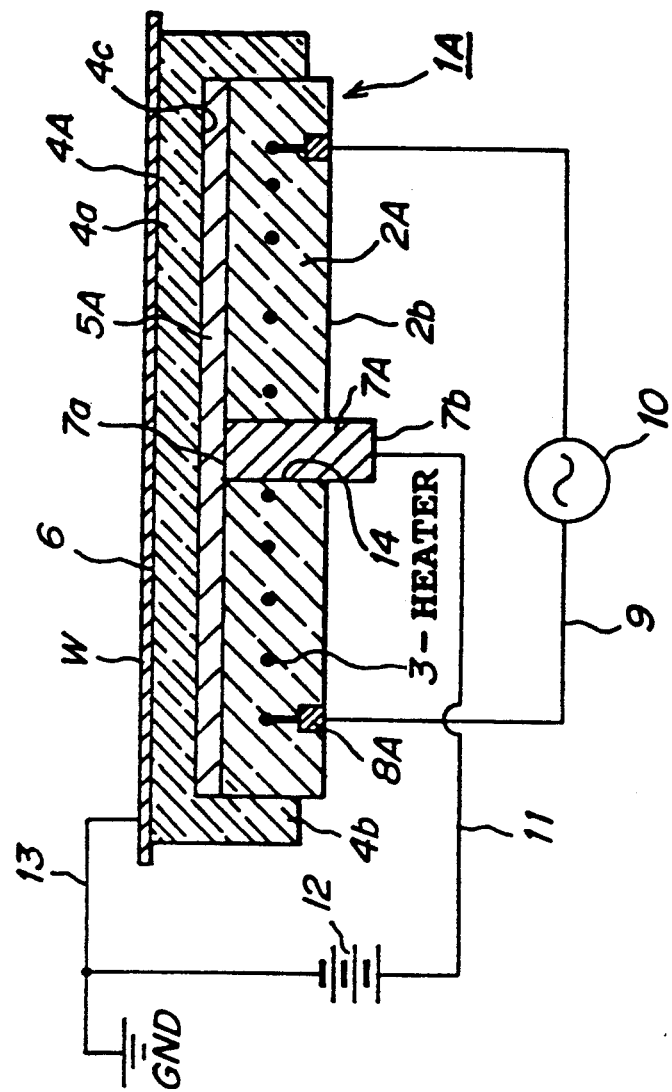
FIG. 3 is a schematic cross-sectional view of an example of the present wafer heating apparatus 1A.

Referring to FIGS. 2 and 3 respectively of a cross-sectional view of the present wafer heating apparatus of this embodiment before and after assembling, an embodiment is shown wherein a ceramic dielectric layer 4A of a flat disc shape is prepared by sintering a ceramic green sheet. The ceramic dielectric layer disc 4A has a ring shaped flange portion 4b formed at its circumferential periphery, and the flange portion 4b has a disc shaped recess 4c at the inner side thereof.

Also, a sheet disc 5A made of an electrically conductive adhesive is prepared which functions also as a film electrode 5A as described below. A disc shaped ceramic substrate 2A is prepared by sintering a ceramic green sheet. The ceramic green sheet 2A has at its central portion a circular penetration hole 14 for receiving a terminal 7A inserted therein. A front surface 2a of the ceramic substrate 2A is opposing to the film electrode 5A. A pair or a massive terminals 8A are exposed on the other front surface 2b of the ceramic 2A. Each terminal 8A is embedded in the ceramic substrate 2A and connected to the heat generating resistive element 3.

In plan view, the heat generating resistive element 3 is embedded in a swirl pattern, more particularly in a spiral form in the disc shaped ceramic substrate 2A. Also, a columnar terminal 7A is prepared.

For forming the ceramic dielectric layer 4A, press forming, or tape cast forming, etc., can be used. For forming the ceramic substrate 2A, the heat generating resistive element 3 and the terminals 8 are embedded in a ceramic material which is then formed by press forming, or cold isostatic press forming, etc., and sintered by hot press sintering, or hot isostatic press sintering, etc.

The film electrode 5A is accommodated in the recess 4c so as to abut to the surface of the dielectric layer 4A, and the front surface 2a of the ceramic substrate 2A is abutted to the surface of the film electrode 5A. Then, the columnar terminal 7A is inserted in the penetration hole 14 and an end surface 7a of the columnar terminal 7A is abutted to the film electrode 5A. A powdery adhesive is interposed between the wall surface of the penetration hole 14 and the side circumferential wall of the columnar terminal 7A. In this state, the thus obtained assembly is subjected to a heat treatment to join the dielectric layer 4A and the substrate 2A by means of the film electrode 5A made of the electrically conductive adhesive, as shown in FIG. 3. Simultaneously, the columnar terminal 7A is joined and fixed to the penetration hole 14 of the substrate 2A. Subsequently, the surface of the dielectric layer 4A is worked by grinding to smoothen the wafer-attracting surface 6.

An end surface 7b of the columnar terminal 7 is connected to a cable 11 and the cable 11 is connected to the positive electrode of a power source 12 of an electrostatic chuck, and the negative electrode of the power source 12 are connected to an earth wire 13.

The pair of terminals 8A is connected respectively to the cable 9 and the cables 9 are connected to a heater power source 10.

For attracting a wafer W, the wafer W is mounted on the wafer-attracting surface 6 and the earth wire 13 is contacted with the wafer W. Then, an electric positive charge is accumulated on the film electrode 5A to polarize the the dielectric layer 4A, and an electric positive charge is accumulated on the wafer-attracting surface 6 of the dielectric layer 4A. At the same time, a negative electric charge is accumulated on the wafer W to attract the wafer W to the wafer-attracting surface 6 by Coulomb's force between the dielectric layer 4A and the wafer W. Simultaneously, the heating resistive element 3 is energized to heat the wafer W.

According to the wafer heating apparatus 1A as shown in FIG. 3, similar effects as described in the above Example 1 can be achieved. In this example, the sintered dielectric layer 4A and the substrate 2A joined by means of the electrically conductive adhesive and the formed electrically conductive layer in situ is used as the film electrode, so that a need of providing an electrode plate, etc., can be dispensed with, the structure is quite simple, and production steps can be decreased.

Moreover, because the wafer heating apparatus has the flange portion 4b, a discharge of electric current is not formed between the film electrode 5A and the semiconductor wafer W even at a high or medium vacuum condition of, for example, not more than $10^{-3}$ Torr.

Furthermore, this example has a large characteristic feature in the production method of the apparatus. This point will be explained in more detail in sequence, hereinafter.

We made extensive studies on a method of producing the wafer heating apparatus 1 of the structure as shown in FIG. 1. Namely, we first studied a method of forming the film electrode 5 by screen printing on a green sheet of the ceramic substrate 2, and laminating thereon a thin ceramic green sheet (for forming the dielectric layer 4), and press forming the laminated structure.

However, if the size of the electrostatic chuck became large, the large chuck was very difficult to exert a uniform pressure on the laminated structure. Therefore, even when the laminated structure was sintered, the thickness of the dielectric layer 4 became unavoidably fractured. The thickness of the dielectric layer 4 is usually very thin of not more than 400 μm, so that the wafer-attracting forces on the wafer-attracting surface 6 fractured even when the thicknesses were fractured on the order of a few tens of μm. Particularly, a purposed wafer-attracting force was not obtained on the dielectric layer 4 at relatively thick portions, so that sometimes correction of deflection of the wafer became insufficient. On the other hand, insulation withstanding voltage of the dielectric layer 4 locally decreased at relatively thin portions thereof. Because the insulation withstanding voltage-decreased portion determined the insulation withstanding voltage of the final product wafer heating apparatus, the insulation withstanding voltage of the whole product was sometimes extremely decreased.

When sintering the laminated structure, insufficient coherence occurred locally on the green sheet of the laminated structure. This was considered caused by shrinkage thereof during the sintering.

Such insufficient coherence was observed under a survey type electron microscope, etc., to frequently find out micro gaps on the order of 0.1-a few μm in the laminated structure. When such a wafer heating apparatus was used in a system for producing semiconductors, the following problems occurred.

Namely, a wafer was set to a use condition of a temperature of 450° C. and a molecular flow region of a vacuum of not more than $10^{-3}$ Torr. When the temperature of the wafer fixed by the electrostatic chuck was monitored by an infrared radiation thermometer, a local region was formed of a different temperature from that of the surrounding regions so that the required homogeneity (of ±3° C.) of heating temperature was not acquired. The temperature difference reached sometimes more than 150° C., as the case may be. At the worst condition, the dielectric layer was broken due to thermal stress.

Regarding the above problems, we made studies on gaps of the joining portion of the sheets of the laminated structure. As a result, we have found out that the pressure in the gap of the joining portion of the sheets was changed under an influence of the pressure in the chamber of the semiconductor production system. Particularly, in the case of heating the wafer W in a vacuum, the behavior of the gas molecules was in a viscous flow region under a pressure of ranging from atmospheric to vacuum of 1 Torr. However, the behavior of the gas molecules changed to a molecular flow region with a further increase of the extent of vacuum, and accompanying thereto the heat transfer at the portions surrounding the gap portion was effected substantially solely by heat radiation to cause the gap portion to a heat isolated state. Hence, the temperature of the dielectric layer above the gap portion was decreased and the portions not having the gap show a high temperature due to good heat transfer thereat. This is the reason of forming a local region of a different temperature from the temperature of the surrounding portions.

If such a conventional method adopted in producing electrostatic chucks was applied to a wafer heating apparatus as shown in FIG. 1 (or FIG. 3), fluctuation of the thicknesses of the dielectric layer and insufficient coherence of the dielectric layer to the ceramic substrate at the interface thereof unavoidably occurred. Such fluctuation of the thicknesses of the dielectric layer is also caused by geometrical inclination, i.e., deflection of the film electrode. Therefore, if the surface of the dielectric layer is worked by grinding to a smooth surface after finishing the integral sintering, the thickness of the dielectric layer could not be made uniform and of course the insufficient coherence could not be corrected.

In contrast, in the method of this example, the dielectric layer 4A is prepared by sintering of the ceramic green sheet and the sintering shrinkage has already been finished at the sintering stage, so that the dielectric layer 4A is deformed no further at the step of joining it to the ceramic substrate 2A.

Because in this way the dielectric layer 4A in this example is not deformed, the thickness of the dielectric layer 4A can be made exactly uniform by working the surface of the dielectric layer 4A to a smooth surface. Therefore, a local decrease of the wafer-attracting force and a local decrease of the insulation withstanding voltage can not occur. Moreover, because the gaps caused by sintering shrinkage are not formed between the dielectric layer 4A and the ceramic substrate 2A, a superior uniform heating and a splendid thermal shock resistant property of the dielectric layer 4A can be obtained.

The same materials as those described in Example 1 may be used as materials of the ceramic substrate 2A and the dielectric layer 4A of this example.

As the material of the columnar terminal 7A, Kovar, tungsten, molybdenum, platinum, titanium, and nickel, etc., can be used.

As the electrically conductive adhesive, an adhesive, such as a gold solder containing a titanium component, or a silver solder containing a titanium component, is preferable. This is because the titanium component contained in the solder diffuses into the ceramic materials by the heat treatment to improve the joining force of the respective ceramic members. These adhesives have a good joining property particularly to silicon nitride. Though in a wafer heating apparatus which uses a temperature of not less than 300° C. the dielectric layer 4A sometimes suffers from thermal shock when the wafer of an ambient temperature is transferred thereto by a transferring robot and fixed by the chuck and heated to the temperature, the thermal shock resistant property of the wafer heating apparatus is further improved due to relaxation of a stress by plastic deformation of the used solder, for example, the gold solder containing the titanium component.

The wafer heating apparatus 1A was produced following the process steps shown in FIGS. 2 and 3 except that the dielectric layer 4A and the substrate 2A were respectively made of silicon nitride and prepared by hot press sintering at 1850° C. The terminals 8A and the heat generating resistive element 3 are made of tungsten.

A sheet disc 5A of a thickness of 100 μm was prepared having a composition of 71.2 wt. % of silver, 27.9 wt. % of copper and 0.8 wt. % of titanium. A powdery silver solder having the same composition with the disc was interposed between the columnar terminal 7A and the penetration hole 14. The obtained assembly was heat treated in a hot press firing furnace while applying a pressure of not less than 50 g/cm$^2$ in the vertical direction of FIG. 2 to perform soldering of the columnar terminal 7A and the penetration hole 14. In order to prevent oxidization of the silver solder containing the titanium component, the soldering was effected in an atmosphere of a pressure of not more than $10^{-5}$ Torr. The heat treatment was effected at 900° C. for 60 seconds. Temperature increase or decrease to the maximum temperature of 900° C. was preferably performed as quickly as possible within such a range that the ceramic materials were not destroyed due to thermal shock. In this example, a temperature increasing or decreasing rate of 600° C./hr was used because of the use of silicon nitride having a high thermal shock resistant property.

The wafer heating apparatus 1A after being heat treated was taken out from the heating furnace and the surface of the dielectric layer 4A was worked by grinding to adjust the thickness thereof to 300 μm, for example.

EXAMPLE 3

Referring to FIGS. 4–8, production steps for producing another embodiment of the present wafer heating apparatus 1B will be explained hereinafter, wherein the same reference numerals as those of FIGS. 2 and 3 are used for the same members having the same function and the explanations thereof are omitted, as the case may be.

Figure 4:
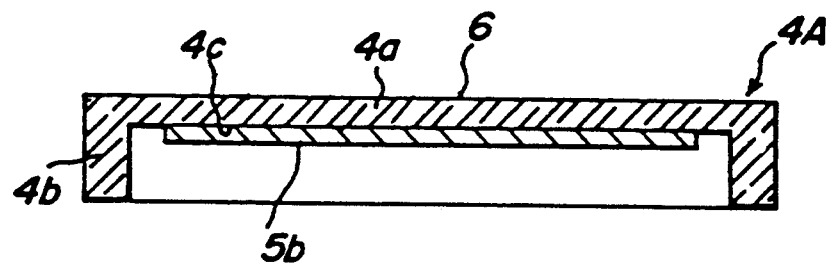
FIG. 4 is a schematic cross-sectional view of a dielectric layer on which a film electrode 5B is formed on a surface of the recess 4c of the dielectric layer.

At first, the film electrode 5B is formed on the surface of recess 4c of the dielectric layer 4A, as shown in FIG. 4.

Figure 5:
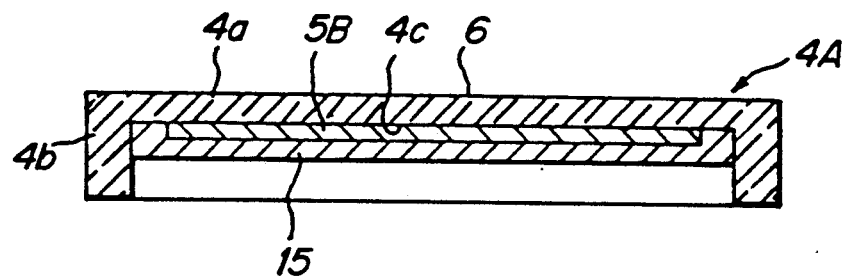
FIG. 5 is a schematic cross-sectional view of a dielectric layer wherein an electrically insulative adhesive layer 15 is formed on the surface of the film electrode 5B formed on the recess 4c of the dielectric layer.

Next, an electrically insulative adhesive layer 15 is applied on the recess 4c by coating, etc., as shown in FIG. 5. At this time, the film electrode 5B is coated with the electrically insulative adhesive layer 15.

Then, the substrate 2A having a disc shape as shown in FIG. 6 is inserted in the recess 4c to abut the surface of the substrate 2A to the electrically insulative adhesive layer 15 as shown in FIG. 5. The thus obtained assembly is heat treated to join the front surface 2a of the substrate 2A and the surface of the dielectric layer 4A having the film electrode 5B thereon as shown in FIG. 6 by means of the heat treated electrically insulative adhesive layer 15.

Thereafter, the electrically insulative adhesive layer 15 is circularly peeled off at the penetration hole 14 to form a circular peeled-off portion 15a, thereby to expose a portion of the surface of the film electrode 5B corresponding to the circular peeled-off portion 15a to the penetration hole 14, as shown in FIG. 7.

Subsequently, a powder consisting of the electrically conductive adhesive is interposed between the columnar terminal 7A and the substrate 2A and the thus obtained assembly is heat treated to join the columnar terminal 7A to the substrate 2A, while abutting the end surface 7a of the columnar terminal 7A to the film electrode 5B, as shown in FIG. 8. Thereafter, the wafer-attracting surface 6 is worked by grinding. The other matters are substantially the same as those described in FIGS. 2 and 3.

A wafer heating apparatus was produced in practice according to the production steps shown in FIGS. 4–8, except that the film electrode 5B was produced by screen printing of tungsten, and the dielectric layer 4A after formation of the film electrode 5B thereon was heated to a temperature of not less than 120° C. to evaporate an organic solvent remaining in the printed film electrode 5B. Both the dielectric layer 4A and the substrate 2A were made of silicon nitride. The film electrode 5B is alternatively made of molybdenum, or tungsten, etc.

As the electrically insulative adhesive, a sealing glass was used. More concretely explained, an oxynitride glass of the following composition was used.

$Y_2O_3$... 30 wt. %
$Al_2O_3$... 30 wt. %
$SiO_2$... 30 wt. %
$Si_3N_4$... 10 wt. %

When sealing the substrate 2A and the dielectric layer 4A by the sealing glass, the substrate 2A and the dielectric layer 4A are heated in nitrogen atmosphere at 1,500° C. under a pressure of not less than 50 g/cm² in a hot press firing furnace.

When joining the columnar terminal 7A to the substrate 2A, a powder of a titanium vapor deposited silver solder consisting of 71.3 wt. % of silver, 27.9 wt. % of copper and 0.8 wt. % of titanium was used.

In order to prevent oxidization of the titanium vapor deposited silver solder, the soldering was effected in an atmosphere of a pressure of not more than $10^{-5}$ Torr. The heat treatment was effected at 900° C. for 60 sec in a furnace. A temperature increasing or decreasing rate to the maximum temperature of 900° C. was 600° C./hr. After the heat treatment, the treated wafer heating apparatus was taken out from the heating furnace and worked by grinding at the surface of the dielectric layer 4A to adjust the thickness thereof to, for example, 300 μm. The terminal 8A and the heat generating resistive element 3 were formed of tungsten.

EXAMPLE 4

Figure 9:
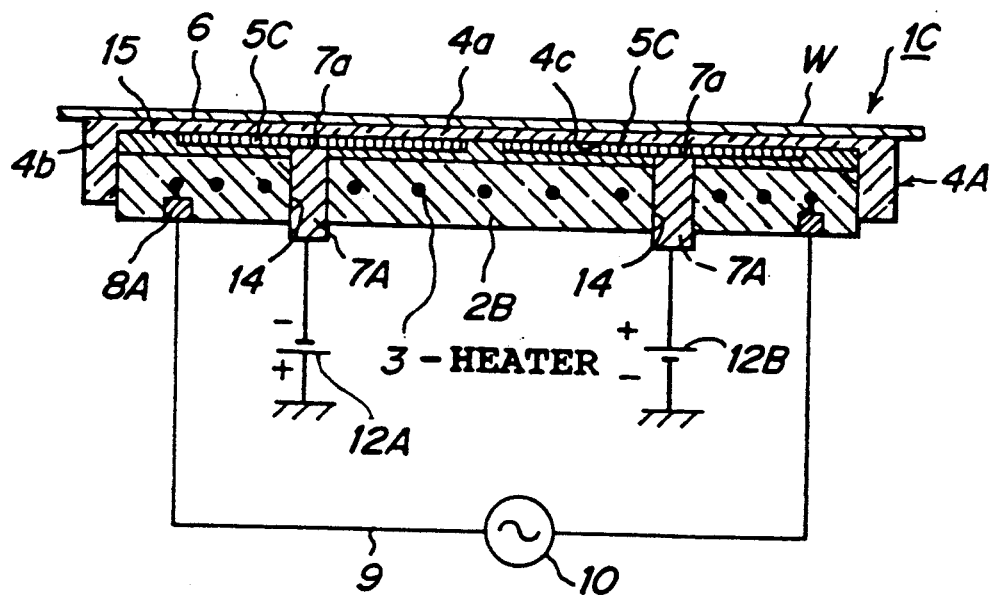
FIG. 9 is a cross-sectional view of the wafer heating apparatus 1C of an embodiment of the present invention.

An example of a dipolar type wafer heating apparatus 1c is shown in FIG. 9. In this heating apparatus 1c, the ceramic substrate disc 2B is provided with two circular penetration holes 14 each having the columnar terminal 7A inserted and fixed therein. Two flat circular film electrodes 5C are formed on the surface of the recess 4c. To the central portion of each film electrode 5C is respectively abutted the end surface 7a of the terminal 7A. The left terminal 7A in FIG. 9, is connected to the negative electrode of the direct current power source 12A, and the positive electrode of the direct current power source 12A is grounded to the earth. The right terminal 7A in FIG. 9, is connected to the positive electrode of the direct current power source 12B, and the negative electrode of the direct current power source 12B is grounded to the earth.

In the above examples, the wafer-attracting surface 6 is shown as facing upward, however, the wafer-attracting surface 6 may be faced downward.

In the above examples, the whole shape of the wafer heating apparatus is preferably a disc shape for uniformly heating the circular wafer W. However, other shapes, such as square, hexagonal, may also be used.

Such wafer heating apparatus is usable as a wafer heating apparatus in an epitaxial system, a plasma etching system, or a photoetching system, etc. Also, the wafer W is not solely restricted to a semiconductor wafer, and other conductor wafers, such as AL wafer, or Fe wafer, etc., may be subjected to the wafer attracting and heating treatment.

According to the wafer heating apparatus of the present invention, a film electrode is formed on a front surface of the ceramic substrate, a ceramic dielectric layer is formed on the front surface of the ceramic substrate to coat the film electrode, and both the substrate and the dielectric layer are made of ceramic materials, so that the wafer heating apparatus can also be used to high temperature usages, such as thermal CVD system, etc., when attracting the wafer to the wafer-attracting surface of the ceramic dielectric layer.

Moreover, the heat generating resistive element is embedded in the interior of the ceramic substrate and heat generated under energization to heat the wafer, so that the wafer is attracted at the whole surface to the wafer-attracting surface of the ceramic dielectric layer by Coulomb's force and simultaneously heated at the whole surface via the wafer-attracting surface. As a result, the wafer can be easily heated uniformly at the whole surface, so that the occurrence of local gaps between the wafer and the wafer-attracting surface (i.e., the wafer-heating surface) at the time of heating the wafer can be prevented. Therefore, production yield of wafers at the time of heating the wafers can be exceedingly improved.

Furthermore, the heat generating resistive element is heat generated at the state of attracting the wafer to the wafer-attracting surface of the ceramic dielectric layer to directly heat the wafer by the wafer-attracting surface, so that a high heat efficiency can be obtained at the heating.

Although the present invention has been explained with specific examples and numeric values, it is of course apparent to those skilled in the art that various changes and modifications thereof are possible without departing from the broad spirit and aspect of the present invention as defined in the appended claims.

We claim:

1. A wafer heating apparatus for use in a gas-containing chamber, comprising:

a substantially gas-tight, unitary sintered ceramic substrate, a heat-generating resistive element embedded in the interior of and integrally bonded to the ceramic substrate, whereby said heat-generating resistive element is sealed from communication with the gas, a film electrode formed on a front surface of the ceramic substrate, and a ceramic dielectric layer formed on the front surface of the ceramic substrate to coat the film electrode;

a direct current power source which generates Coulomb's force between a wafer and a wafer-attracting surface of the dielectric layer to attract the wafer to the wafer-attracting surface; and a power source for energizing the heat-generating resistive element to thereby heat the wafer.

2. The apparatus of claim 1, wherein both the ceramic substrate and the ceramic dielectric layer are made of a non-oxide series ceramic material.

3. The apparatus of claim 1, wherein the ceramic substrate has a coefficient of thermal expansion of 0.7–1.4 times that of the wafer.

4. The apparatus of claim 1, wherein the ceramic dielectric layer has a coefficient of thermal expansion of 0.7–1.4 times that of the wafer.

5. The apparatus of claim 1, wherein the film electrode is made of an electrically conductive adhesive which joins the ceramic dielectric layer to the ceramic substrate, and at least one electric terminal is connected to the film electrode.

6. The apparatus of claim 1, wherein the film electrode is joined to a surface of the ceramic dielectric layer, a surface of the film electrode of the ceramic dielectric layer is joined to the front surface of the ceramic substrate by means of an electrically insulative adhesive layer, and at least one electric terminal is connected to the film electrode.

* * * * *